(12) United States Patent
Waffenschmidt et al.

(10) Patent No.: US 7,855,498 B2
(45) Date of Patent: Dec. 21, 2010

(54) LIGHT-EMITTING DEVICE WITH A SEALING INTEGRATED DRIVER CIRCUIT

(75) Inventors: Eberhard Waffenschmidt, Aachen (DE); Edward Willem Albert Young, Maastricht (NL); Dirk Hente, Wurselen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 365 days.

(21) Appl. No.: 11/996,597

(22) PCT Filed: Jul. 18, 2006

(86) PCT No.: PCT/IB2006/052453
§ 371 (c)(1),
(2), (4) Date: Jan. 24, 2008

(87) PCT Pub. No.: WO2007/013001
PCT Pub. Date: Feb. 1, 2007

(65) Prior Publication Data
US 2008/0231180 A1    Sep. 25, 2008

(30) Foreign Application Priority Data
Jul. 27, 2005    (EP) .................................. 05106924

(51) Int. Cl.
*H01J 1/62* (2006.01)
(52) U.S. Cl. ........................ 313/495; 313/496; 313/512; 313/511; 313/506

(58) Field of Classification Search ................. 313/495, 313/496, 512, 511, 506, 484, 483, 110; 315/169.3, 315/169.4
See application file for complete search history.

(56) References Cited

U.S. PATENT DOCUMENTS

| 5,703,394 | A | 12/1997 | Wei et al. | |
| 6,893,896 | B1 | 5/2005 | Wagner | |
| 2003/0197475 | A1* | 10/2003 | Takamura et al. | ......... 315/169.4 |
| 2007/0139575 | A1* | 6/2007 | Wang | ........................... 349/58 |

FOREIGN PATENT DOCUMENTS

| EP | 1283663 A2 | 2/2003 |
| EP | 1437703 A1 | 7/2004 |
| WO | 0157938 | 8/2001 |
| WO | 0239513 A1 | 5/2002 |
| WO | 03034513 | 4/2003 |
| WO | 2005020253 | 3/2005 |
| WO | 2006087653 | 8/2006 |

\* cited by examiner

*Primary Examiner*—Tuyet Thi Vo

(57) ABSTRACT

The invention relates to light-emitting diodes (O-LED). In particular, it relates to the driver electronics needed for these devices. An organic electroluminescent device is provided, which has a hermetically closed very flat housing. To improve the functionality of an O-LED, considerably reduce the height of an O-LED module and allow a cost-effective mass production, the driver circuit and the electronic driver elements or the printed circuit board (PCH) with the electronic driver elements are incorporated into the cover plate of the device.

11 Claims, 2 Drawing Sheets

LIGHT-EMITTING DEVICE WITH A SEALING INTEGRATED DRIVER CIRCUIT

The invention relates to an electroluminescent, e.g. a light-emitting device (O-LED) with a sealing integrated driver circuit. In particular, it relates to the driver electronics needed for this device. Such a device comprises a transparent substrate and a cover plate having a first side facing the transparent substrate and a second side opposite the first side, at least one electroluminescent element comprising an organic electroluminescent layer arranged between the transparent substrate and the cover plate, and an intermediate sealing means joining the transparent substrate and the cover plate.

Organic light-emitting diodes (O-LED) are a high-potential solution for future light sources. They are expected to become a high-efficiency light source in a wide area for cost-effective manufacture. However, they typically need driving electronics to adapt the available supply voltage to the required current of the O-LED. In order to achieve a high efficiency of the whole system, these driving electronics should be switched-mode power supplies with various types of electronic components. In order to integrate this circuit, a printed circuit board (PCB) mounted on the rear side of the O-LED can be used, so that a tight and flat construction is obtained.

Such a device is disclosed in WO 03/034513. The intermediate sealing means of the device is used as the substrate for the driving electronics. The problem is that the conventional components needed for these electronics are typically bulky and stiff elements. This is in contrast to the thin and, if possible, flexible O-LED elements. The devices described in WO 03/034513 are based on a substrate layer made of glass and a circuit board made of ceramics.

It is therefore an object of the invention to provide an organic electroluminescent device of the type mentioned in the opening paragraph, which is provided with a hermetically closed very flat housing. Moreover, it should improve the functionality of an O-LED, considerably reduce the height of an O-LED module and allow cost-effective mass production.

This object is realized in that the driver circuit and the electronic driver elements or the printed circuit board (PCB) with the electronic driver elements are incorporated into the cover plate of the device.

Consequently, all driver components can be arranged together with the O-LED in a construction which is as flat as possible. As a result, the device is much flatter than that cited in the state of the art.

In the functional result of the invention, the technical fact that an O-LED is naturally flexible in itself is used to distinguish this feature by constructing a circuit board which is just as flexible as the O-LED. The complete device thus finally remains flexible, which is a great advantage in a large number of possible technical applications. This combination of a flat construction and great flexibility results in a very flat and effective device.

A further advantage of the invention is that a lamp covering a large area consists of a number of cells. The invention allows equipping each cell with its own driver on the rear side. In this way, each cell may be easily controlled in order to achieve a homogeneous light output of all cells or the application of certain light patterns. Various electronic functionalities are possible, which can be integrated in the back of an O-LED by using this inventive compact, yet flexible construction.

Due to the provision of the driver device, a very simple supply may be a series resistor which can be integrated in the circuit board to adjust the device, e.g. the diode current to the supply voltage. This resistor may be chosen from another flexible material.

A somewhat more advanced solution may be a linear control circuit, which is e.g. realized with a current-controlled transistor. Since this transistor does not need to be fast, printed polymer transistors can also be used, so that the construction remains both flat and flexible.

The driving electronics preferably consist of a DC/DC converter. A step-down converter with current control is applied for a supply voltage which is higher than the diode voltage of the O-LED. A step-up converter with current control is applied for a supply voltage which is lower than the diode voltage. A flyback converter with an integrated transformer may also be used for a large difference between supply voltage and diode voltage. The secondary side diode of the flyback can be omitted and the O-LED can be used for this purpose. Each converter is equipped with a control stage, such that the output of each cell can be controlled individually. This is important for generating light patterns using invention-related O-LEDs.

Also coils, which are flat and flexible, can be produced and incorporated into the device. These coils are needed for several applications. The coils serve for the remote powering of the O-LED (a wireless powered O-LED). This combination is very effective because flexible O-LEDs for generating light patterns can be obtained, which O-LEDs are as flat as films, because no external-to-internal connection of conducting paths is necessary.

It is possible to integrate further electronic elements such as WIFI for remote communication between O-LED systems and/or passive filters consisting of LC combinations in order to filter disturbances, and also passive narrow-band filters consisting of LC-combinations (e.g. a series resonator), wherein each filter selects a certain frequency without reducing the flexibility of the complete device.

Different O-LED cells are provided with filters of different center frequencies. Each cell may then be controlled by its related frequency. Groups of cells may have the same frequency, e.g. all red cells, all green cells, and all blue cells have the same frequency. The RGB-color of all cells can thus be jointly controlled.

Each cell may be equipped with a tiny transformer integrated in the PCB to adapt an AC-bus voltage to the cell current. The secondary side of the transformer may be equipped with an additional rectifier stage (e.g. full bridge, half bridge, or single diode rectifier). Alternatively, two neighboring cells can be connected in an anti-parallel way, thus working as a rectifier. In this way, no additional external rectifier is necessary.

The primary side of the transformer can be distributed across a large area covering a number of cells. In every cell, a secondary winding picks up a part of the magnetic flux to drive the cell. In this way, no interconnections to each individual cell are necessary.

Integrated capacitors may act as analog sample-and-hold devices to allow easy multiplexing of a large number of cells.

Intelligence is added to the driver for stand-alone operation of each cell, e.g. for setting individual light patterns or color schemes.

As a solution, the printed circuit board (PCB) on the rear side contains integrated, planar components. This can be realized either as an assembly or as a fully integrated O-LED device in which the rear side is made of a printed circuit board. In this way, the sealing of the O-LED even performs an electronic function. A further Figure shows an example with an integrated inductor. The aspect ratio in the Figures is not 1:1, but the thickness of the printed circuit board (PCB) is exaggerated. Also further passive components such as capacitors or resistors can be integrated in the PCB.

All of these combinations of features with the features defined in the independent claim open up an immense field of application of invention-related O-LEDs which are flat and flexible or bendable. In the invention, polymer materials are used by way of example for printed circuit boards. As compared with the state of the art, it is an advantage that this type of material is less expensive and is available in larger sizes than ceramic materials. By using a flexible printed circuit board material such as polyimide, also flexible components can be integrated in this flexible substrate, which even comprises inductors.

In this way, the sealing and the electronics can be made flexible, so that a completely flexible or bendable display module can be obtained.

It is also advantageous that, in one explicit solution, each cell or group of cells is equipped with electronic bus-address units, by which each luminescent element or cell or group of luminescent elements or cells can be identified and selectively generated. Each cell or group of cells can thus be generated selectively, and no conductive paths are necessary in combination with a contactless inductive intercoupling.

In the context of the invention, the electronic elements for the bus-address units are also implemented and incorporated into the cover plate in the way described. In a particular combination, this bus-address circuit is also constructed with planar components only, and, in a special solution, such a device is flexible or bendable.

It is thus possible to create semiconductor elements in such a thin construction that they are flexible or bendable. This can be realized with classical anorganic semiconductors as well. Dimensions of thickness must be less than 100 micrometers.

These and other aspects of the invention are apparent from and will be elucidated with reference to the embodiments described hereinafter.

In the drawings:

FIG. 1 is a cross-sectional view of an O-LED 20 with a flexible foil as top sealing 10 and interconnection. The complete structure is layered, rendering it flexible and bendable.

Figure 1:
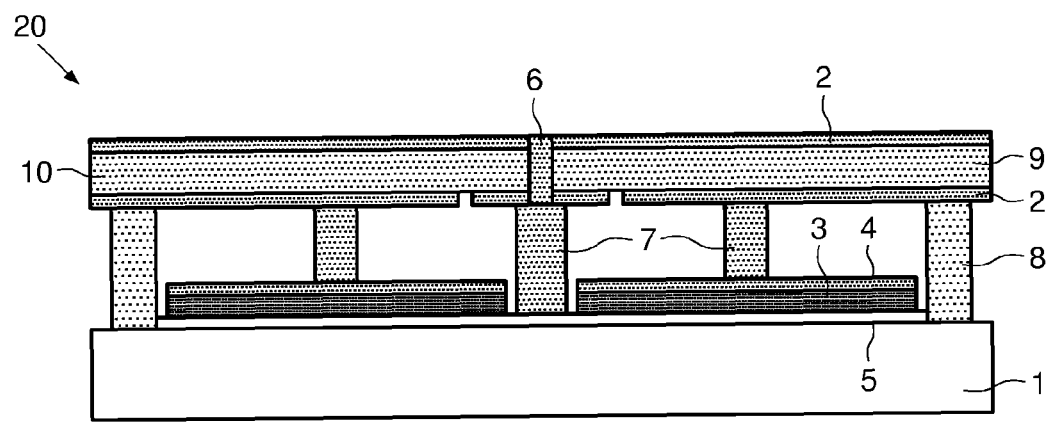
FIG. 1 shows an O-LED with a flex foil as top sealing.

The transparent substrate 1 on the light-emitting side of the O-LED 20 is a light-transmitting flexible material in the sense of the disclosed invention. The flex foil 10 is a layer with a polyimide core with copper layers 2 on both sides in order to realize an interconnection between the inner O-LED and the outer conducting paths. Therefore, this flex foil is bendable.

The O-LED cells 3 are located between the flex foil 10 and the transparent substrate 1. The O-LED cells themselves consist of a conducting layer 4 on one side and a transparent conducting layer 5 on the other side which faces the transparent substrate 1. The active O-LED layer is located between the conducting layer 4 of the O-LED cell and the transparent conducting layer 5 of the O-LED.

The transparent conducting layers of several O-LED cells can be kept together, but the conducting layers on the other side of the O-LEDs must be separated, i.e. they have to be isolated from each other in order to activate each O-LED itself, i.e. independently of each other.

The gap between the transparent substrate and the flex foil is sealed with a side sealing 8 at least at the outer sides of an O-LED.

The conducting layers of the O-LEDs are bonded with conducting posts, which interconnect these conducting rear sides of the O-LEDs with the inner conducting layers, in this case copper layers 2 of the flex foil 10.

The O-LED-cells 3 are preferably positioned on the transparent substrate 1, or, more preferably, on the transparent conducting layer 5 with a defined gap between each other.

The conducting posts 7 for the common transparent conducting layer is located in this gap. The dimensions of the conducting posts 7 and the gaps are combined so as to preclude a shortcut between these conducting posts and the conducting layers of the O-LED cells.

In this respect, it should be considered that no shortcut in the sense described can take place in the range of the predetermined maximal bending or flexing action.

Through the polyimide core 9 of the flex foil 10, there is a conductive via 6 between the conductive layer inside and the conductive layer outside.

Figure 2:
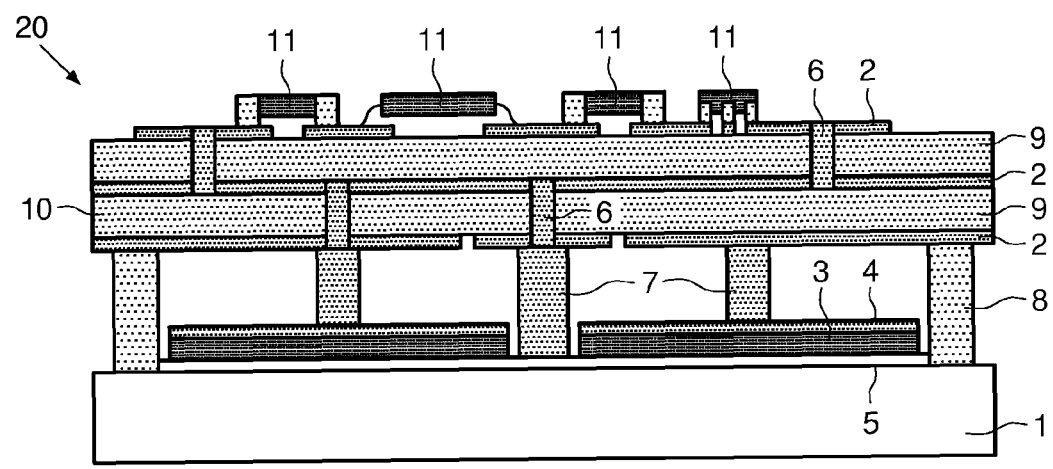
FIG. 2 shows an O-LED with a flex foil as top sealing with a substrate for driver electronics.

FIG. 2 is a cross-sectional view similar to that in FIG. 1. An O-LED 20 is shown with flex foil 10 as a top sealing with substrate for driver electronics 11. The multilayer sandwich construction is similar as in FIG. 1, but the flex foil 10 is a multilayer system with two polyimide cores 9, the first of which has substantially the same construction as in FIG. 1, but the second flex foil layer has an integral circuit board for the driver electronics 11. One possibility for construction is to mount the electronic components 11 on top of this circuit board which is an integral part of the top sealing of the complete device.

Another possibility is to position at least some electronic components in the intermediate layers of the top sealing. In both construction alternatives, the complete device is flexible and bendable and it is necessary to consider the desired range of flexibility so that a satisfactory contact with all electronic components is realized in every case.

In this sandwich construction of the top sealing, the external top surface carries the conductive paths, which may be made of copper layers 2, as is customary for printed circuit boards. Interconnections from these layers to the inner layer of the top sealing downwards are realized by conducting vias 6, which are made of copper in this case.

Figure 3:
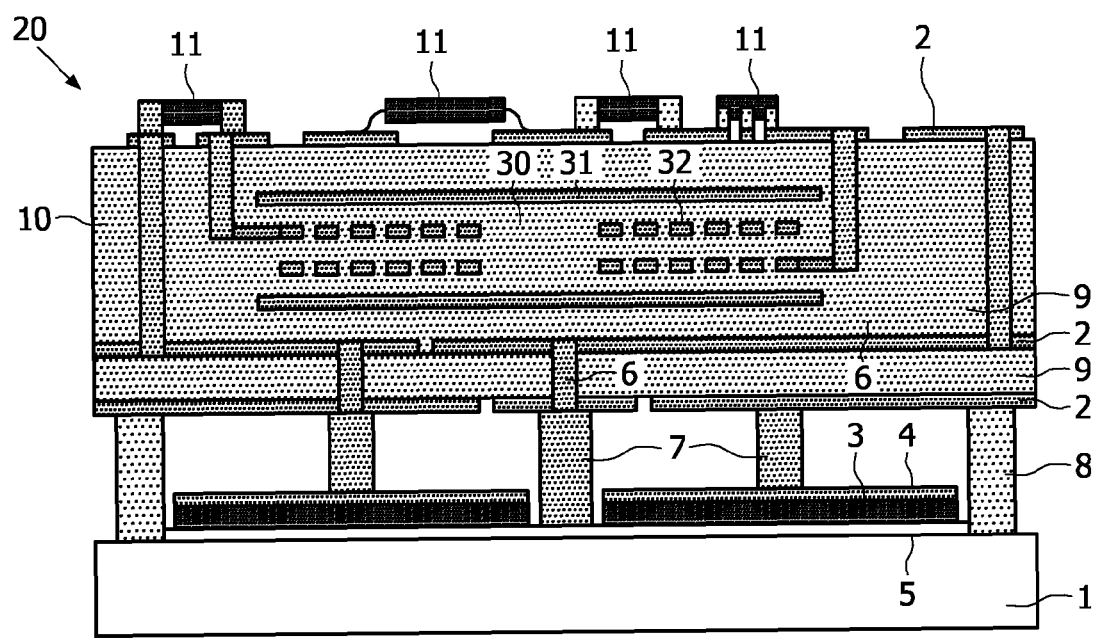
FIG. 3 shows an O-LED with an integrated inductor.

FIG. 3 is a cross-sectional view of an O-LED with an integral inductor 30 which is completely incorporated into the top sealing of this device. In this embodiment, a sandwich construction similar to that in FIG. 2 is shown. The intermediate layer bulk comprises an inductor 30 consisting of a soft magnetic core 31 and a spiral winding 32. These inductor components 31, 32 are completely integrated, i.e. they are completely incorporated into the bulk of the upper layer of the flex foil 10.

Also in this alternative, the flex foil 10 remains flexible and bendable. The spiral winding 32 as well as the soft magnetic cores 31 are therefore created in a thin-layered way. The rest of the construction is similar to that shown in FIG. 2.

The integrated inductor couples with an external inductor. This results in a contactless steering of the O-LED.

Similarly as with inductors, it is possible to integrate capacitors in the sealing top, i.e. the flex foil. This may enable devices to allow easy multiplexing of a large number of cells.

As defined in the claims, the invention leads to a very compact, i.e. flat construction of the O-LED. Furthermore, the flat construction supports the option to create the O-LED in a flexible and bendable way. This special embodiment will generate really new fields of application of O-LEDs.

The invention claimed is:

1. An electroluminescent device with a sealing integrated driver circuit, the device comprising a transparent substrate, a cover plate having a first side facing the transparent substrate and a second side opposite the first side, at least one electroluminescent element comprising an organic electroluminescent layer arranged between the transparent substrate and the cover plate, an intermediate sealing means joining the transparent substrate and the cover plate, and a printed circuit board (PCB) having a plurality of electronic driver elements disposed thereon, wherein the printed circuit board is incorporated into the cover plate, and at least one of the driver elements comprises printed polymer semiconductor material.

2. A device as claimed in claim 1, wherein the plurality of driver elements comprises a series resistor comprising a flexible, electrically resistive material integrated in the printed circuit board.

3. A device as claimed in claim 1, wherein the plurality of driver elements comprises a linear control circuit including a current-controlled transistor.

4. A device as claimed in claim 1, wherein different electroluminescent elements are provided with filters of different center frequencies in order to group different cells to an assembly with different light colors.

5. A device as claimed in claim 1, wherein, in an assembly or an arrangement of several electroluminescent elements or cells, each element or cell is equipped with a transformer integrated in the PCB in order to adapt an AC-bus voltage to the cell current, wherein the second side of the transformer is equipped with a rectifier stage.

6. A device as claimed in claim 1, wherein each cell or group of cells is equipped with electronic bus address units for identifying each luminescent element or group of luminescent elements.

7. A device as claimed in claim 1, wherein the semiconductor elements are bendable or flexible.

8. A device as claimed in claim 1, wherein the transparent substrate and the cover plate comprise a flexible or bendable material.

9. A device as claimed in claim 8, wherein the plurality of driver elements comprises a DC/DC converter including a control stage, such that the output of the at least one electroluminescent element is individually controllable in order to generate light patterns.

10. A device as claimed in claim 1, wherein at least one coil for remote powering of the at least one electroluminescent element is incorporated into the cover plate.

11. A device as claimed in claim 10, wherein the electroluminescent element is an organic light-emitting diode O-LED.

* * * * *